United States Patent [19]

Liebl et al.

[11] Patent Number: 4,978,855
[45] Date of Patent: Dec. 18, 1990

[54] ELECTRON MICROSCOPE FOR INVESTIGATION OF SURFACES OF SOLID BODIES

[75] Inventors: Helmut Liebl, Eching; Bertold Senetinger, Garching, both of Fed. Rep. of Germany

[73] Assignee: Max-Planck-Gesellschaft zur Foerderung der Wissenschaften e.V., Goettingen, Fed. Rep. of Germany

[21] Appl. No.: 476,973

[22] Filed: Feb. 7, 1990

[30] Foreign Application Priority Data

Feb. 10, 1989 [DE] Fed. Rep. of Germany ....... 3904032

[51] Int. Cl.$^5$ .............................................. H01J 37/26
[52] U.S. Cl. .................................. 250/310; 250/305; 250/396 R
[58] Field of Search ........... 250/310, 396 R, 396 ML, 250/305, 397

[56] References Cited

U.S. PATENT DOCUMENTS

| | | |
|---|---|---|
| 2,901,627 | 8/1959 | Wiskott et al. ...................... 250/310 |
| 3,845,305 | 10/1974 | Liebl ................................... 250/310 |
| 4,255,661 | 3/1981 | Liebl ................................ 250/396 R |
| 4,362,945 | 12/1982 | Riecke ........................... 250/396 R |
| 4,537,477 | 8/1985 | Takagi et al. ...................... 250/310 |
| 4,556,794 | 12/1985 | Ward et al. .................... 250/396 R |
| 4,584,474 | 4/1986 | Franchy et al. ..................... 250/305 |
| 4,684,808 | 8/1987 | Plies et al. ....................... 250/396 R |
| 4,866,272 | 9/1989 | Aoki ................................... 250/305 |

FOREIGN PATENT DOCUMENTS 2937004 11/1984 Fed. Rep. of Germany .

OTHER PUBLICATIONS

Applied Physics A 44, 55–61 (1987), "Solids and Surfaces", Surface Imaging with LEEM by W. Telieps.
Ultramicroscopy 17 (1985) 57–66, North-Holland Amsterdam, "An Analytical Reflection and Emission UHV Surface Electron Microscope" by W. Telieps and E. Bauer.
The Review of Scientific Instruments, vol. 33, No. 12, 1340–1343, Dec., 1962, "Duoplasmatron as a Vacuum Ultraviolet Light Source" by James A. R. Samson and H. Liebl.
Optik 80, No. 1 (1988) 4–8 "On the Image Aberration of the Uniform Acceleration Field of an Emission Lens" by Helmut Liebl.

*Primary Examiner*—Bruce C. Anderson
*Attorney, Agent, or Firm*—Brumbaugh, Graves, Donohue & Raymond

[57] ABSTRACT

Electron microscope for investigation of surfaces of solid bodies with a primary beam path along which are arranged sequentially an electron beam source, an electron lens, an energy-selective electrostatic deflecting field, a magnetic deflecting field, a cathode lens, in whose object plane lies the test surface to be investigated, further with a secondary beam path, which passes in sequence through the cathode lens, the magnetic deflecting field, an energy filter, which includes a decelerating lens, a contrast stop, an electrical sector field, an energy stop and an accelerating lens, and two projection lenses, to a detector, such as a luminescent screen. The first-mentioned electrostatic deflecting field compensates for the energy dispersion of the magnetic deflecting field in the entrance side focal plane of the cathode lens. The energy filter limits the energy range of the electrons in the secondary beam path.

16 Claims, 4 Drawing Sheets

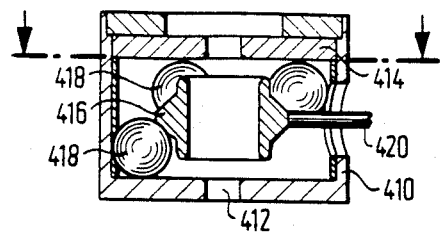
FIG. 3a
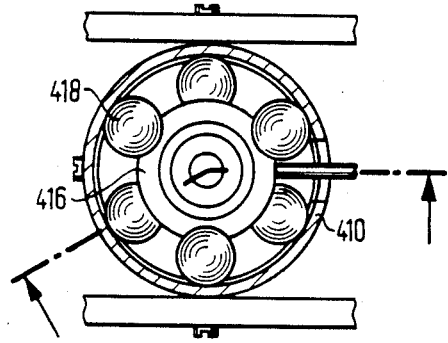
FIG. 3b
FIG. 5
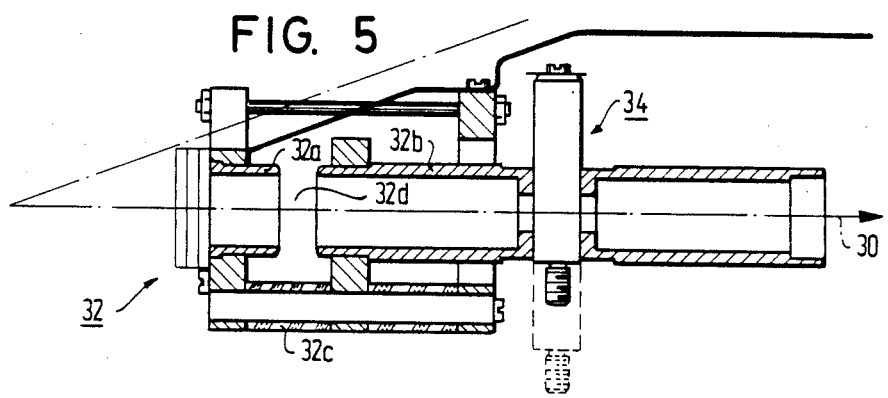
FIG. 6
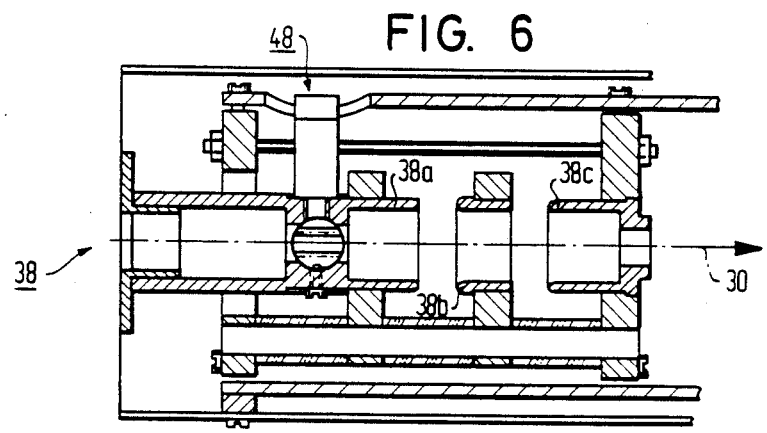

ELECTRON MICROSCOPE FOR INVESTIGATION OF SURFACES OF SOLID BODIES

BACKGROUND OF THE INVENTION (1) Field of the Invention

The present invention is an improvement of an electron microscope with the features which are known from the publication of W. Telieps and E. Bauer, Ultramicroscopy 17 (1985) p. 57.

(2) Description of the Prior Art

In the identified, known electron microscope an electron beam supplied by an electron source is accelerated to an energy of 15 to 20 keV, deflected by a magnetic field and focused by means of an electron lens in the rear focal plane of a cathode lens. In the electric field of the cathode lens the electron beam is decelerated, so that it impinges on a sample surface to be investigated approximately as a parallel beam with low energy, which is adjustable to values from a few up to some 100 electron volts. The electrons elastically reflected from the atoms on the sample surface are accelerated again through the field of the cathode lens to the primary energy; at the same time they interfere with each other because of their wave nature, so that a diffraction pattern (LEED=low energy electron diffraction) results in the rear focal plane of the cathode lens, which represents the lattice arrangement of the surface atoms. In the magnetic field the returning reflected electron beam is separated from the incident primary beam. By means of following electron optics either the enlarged diffraction pattern can be made visible on a display screen or else the sample surface itself, very greatly enlarged. In the latter case the electrons from a single LEED reflection are selected, so that the image resulting on the display screen reproduces the local distribution of the relevant crystal structure.

SUMMARY OF THE INVENTION

The object of the invention defined in the claims and explained below is to solve the problem of improving the sharpness of the image of an electron microscope of the kind identified and enlarging its possible applications.

In the known electron microscope of the kind identified the magnetic field which is necessary to separate the primary and secondary beam paths does not only effect the desired deflection of the primary beam but also effects an energy dispersion, which means that electrons with energies which are somewhat lower or higher than the mean energy of the primary beam electrons are deflected somewhat more or less strongly. In the known electron microscope the imaging of the electron source in the focal plane of the cathode lens is therefore not sharp but exhibits a lateral energy dispersion, even when the imaging through the electron lens is free from aberration, since the electrons provided by the source have a natural energy spread. The energy spread amounts to about 0.3 eV with field emission sources and to about 0.4 to 0.5 eV with thermal electron sources. There exists a one-to-one relationship between the sharpness of the primary beam focus in the focal plane of the cathode lens and the sharpness of the LEED reflection in the same plane, i.e. a blurred primary beam focus results in a correspondingly blurred LEED reflection.

A similar problem exists with the reflected electron beam. The primary electrons can suffer energy losses in the reflection and they also generate secondary electrons. Both effects result in electrons which accompany the elastically reflected "useful" electrons in the beam path but have less energy than these. They can therefore, if their proportion is significant, worsen the contrast and the sharpness both of the LEED pattern and also of the surface image.

These problems are solved according to the invention. Preferably there is associated with the magnetic field both for the primary beam and also for the secondary beam an energy-dispersive electrostatic deflecting field. The electrostatic deflecting field in the primary beam deflects the latter in the opposite direction to the magnetic field and the geometrical and electrical parameters of the electrostatic deflecting field are so selected that the energy dispersion of the primary beam in the focal plane of the cathode lens becomes zero. The image of the electron source in the focal plane and thus also the LEED reflection are accordingly sharper than in the known case.

In corresponding manner the detrimental electrons are eliminated from the secondary beam by a dispersive energy filter, which allows only an energy range of e.g. less than 1 eV to pass, without affecting the electron-optical imaging.

An additional improvement concerns the cathode lens. The achievable lateral resolution depends essentially on the image error caused by the accelerating field before the flat sample surface. This image error is inversely proportional to the field strength obtaining (see H. Liebl, Optik 80 (1988) 4). In the present electron microscope the cathode lens is preferably so constructed that the field strength in front of the sample surface and thus also the lateral resolution are substantially higher than in the known electron microscope.

A further improvement is the constructional integration of an optical mirror microscope objective ("Schwarzschild optics") in the cathode lens. Through this firstly the microscopic observation of the sample surface is possible in situ, secondly UV light can be beamed on to the sample surface through the mirror objective in very efficient manner, so that the present electron microscope can also be used for the purposes of photo-emission microscopy.

BRIEF DESCRIPTION OF THE DRAWINGS

The invention will be explained in more detail below with reference to the drawings, wherein:

FIGS. 3a and 3b are an axial section and a plan view respectively of an electrostatic electron lens;

FIG. 5 is an axial section of a decelerating lens; and

FIG. 6 is an axial section of an accelerating lens.

DESCRIPTION OF THE PREFERRED EMBODIMENT

Figures 1A, 1B:
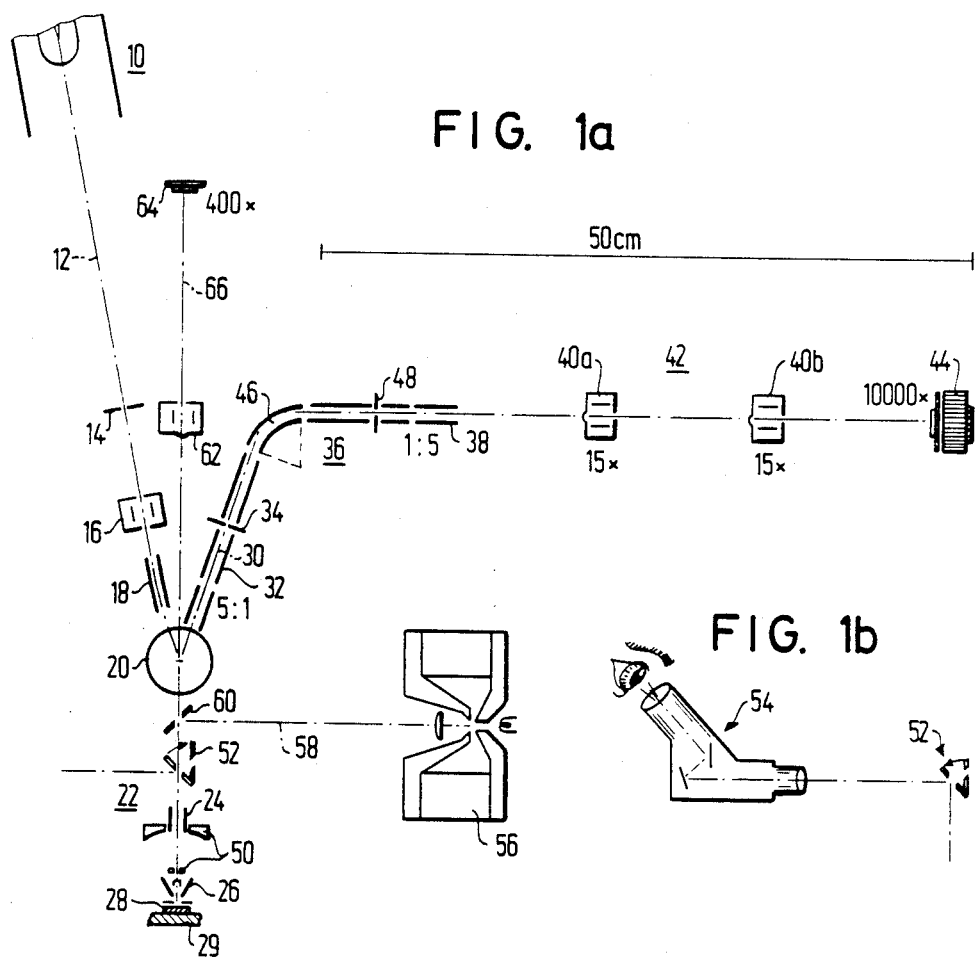
FIG. 1 consisting of FIGS. 1a and 1b, is a schematic diagram of an electron microscope according to a preferred embodiment of the invention.

The electron microscope schematically shown in FIG. 1 is arranged in a vacuum vessel, not shown, and includes an electron beam source 10, which is shown only schematically and can be formed in known manner. The electron beam source 10 generates a primary beam 12 with an energy of approximately 15 to 20 keV. The primary beam 12 passes through in sequence an aperture stop 14, an electron lens 16, an electrostatic deflecting field serving for energy focusing, which is generated by two curved condenser plates 18, a magnetic deflecting field 20, which deflects (bends) the primary beam path through a predetermined, constant angle $\phi$, a stigmator 24, an optical system 22, which will be explained in more detail, and a cathode lens 26, to the surface of a sample 28, which is held on a sample holding device 29.

The electrons returning from the surface of the sample form a secondary beam 30, which passes through in sequence the cathode lens 26, the optical system 22 and the stigmator 24 on the same path as the primary beam, to the magnetic field 20, where it is separated from the primary beam by the oppositely directed deflection. The secondary beam then passes through a 5:1 decelerating lens 32, which reduces the energy of the secondary beam by a factor of 5, then a contrast stop 34, an energy filter 36, a 1:5 accelerating lens 38, which accelerates the secondary beam by the factor of 5 again, and two projection lenses 40a, 40b which form a projection objective 42. In the image plane of the projection objective there is arranged the entrance plane of a detector system 44, which includes two channel plates, secondary electron multipliers, a luminescent screen, a fibre optics window or any other known system for capturing the electron distribution generated in the image plane of the objective.

The electrostatic deflecting field 18 is created by a spherical condenser and deflects the primary beam in the opposite direction to the magnetic deflecting field 20 and is so determined relative to the magnetic deflecting field that an energy focusing of the electrons in the primary beam takes place in the rear focal plane of the cathode lens 26. The condition for the energy focusing is:

$$(D/L'') = (D/f_m) - 1 + (\gamma/\lambda).$$

Figure 2A:
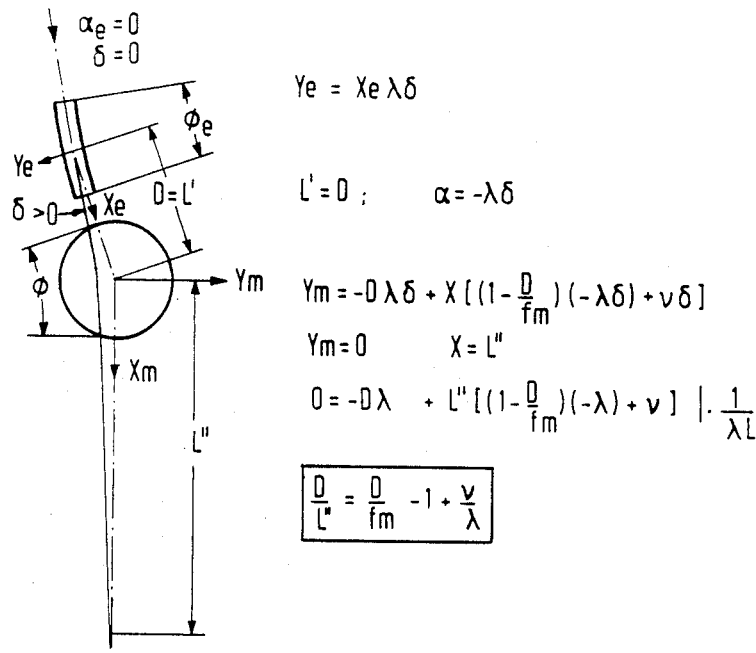
FIG. 2a is a schematic representation of a part of a primary beam path of the electron microscope according to FIG. 1, which includes an electrostatic and an electromagnetic deflecting field, and equations for explaining the energy focusing in the primary beam path.
Figure 2B:
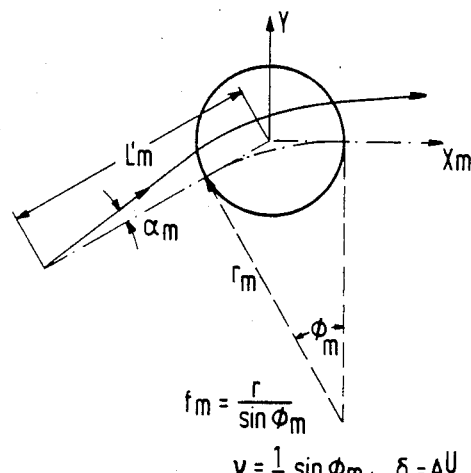
FIG. 2b is a schematic representation of the electromagnetic deflecting field and the associated equations.
Figure 2C:
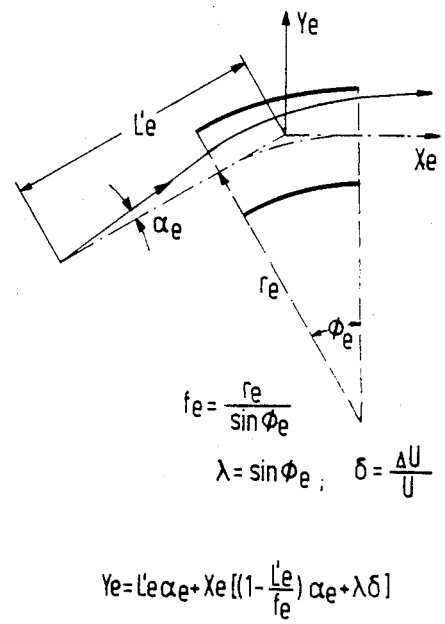
FIG. 2c is a schematic representation of the electrostatic deflecting field and the associated equations.

The derivation of this equation is apparent from FIGS. 2a to 2c. They signify:

U = mean accelerating voltage of the primary beam electrons
$\Delta U$ = deviation of U
X = x-coordinates relative to the centre of the relevant field
Y = y-coordinates relative to the centre of the relevant field
$\alpha$ = entrance angle
$\delta$ = relative energy dispersion of the electrons
$\lambda$ = dispersion factor of the electric field
$\gamma$ = dispersion factor of the magnetic field
D = centre-to-centre spacing electrical field-magnetic field
L' = object distance
L'' = image distance
$\phi$ = sector angle
f = focal length
r = radius of curvature of the deflected beam.

The indices "e" and "m", which are omitted in the above listing, signify that the quantity in question relates to the electric and the magnetic field respectively. For $\phi_m = 20°$; $r_m = 12$ cm; $L'' = 13.5$ cm the solution to the above equation gives D = 5 cm; $\phi_e = 8°$.

The electron lens 16 images the electron source in the rear focal plane of the cathode lens 26. The object plane of the cathode lens 26 coincides substantially with the exit side focal plane of this lens. The stigmator 24 creates an electrostatic octopole field and serves in known manner to compensate for the astigmatism of the secondary beam.

The energy filter 36 includes an energy dispersive electrostatic deflecting field 46, which is created by a spherical condenser with two curved condenser plates, and an energy stop 48, which together form an energy analyzer for selection of the desired energy range, e.g. 1 eV wide.

The optical system 22 includes in the first place a Schwarzschild mirror objective 50, a deviating mirror 52 which can be hinged out of the beam path and which, like the mirror objective has a central aperture for the electron beam 12, 30 and an eyepiece 54. The optical system further includes an actinic source of radiation 56, e.g. a duoplasmatron UV source of radiation (see e.g. J. A. R. Samson and Helmut Liebl, Rev. Sci. Instr., 33, No. 12, 1340–1343, Dec. 1962) in combination with a collimator lens, which provides a collimated beam of UV- radiation 58, which can be reflected into the common part of the beam paths of the electron beams 12, 30 through a second, centrally apertured deviating mirror 60, so that it falls on the surface of the sample 28 when the mirror 52 is hinged out of the beam path, and can there generate photo-electrons. On the other hand the microscope 50, 54, with the mirror 52 swung into the beam path, permits optical observation and positioning of the surface of the sample 28. There are moreover provided a further projection lens 62 and a luminescent screen 64 or any other electron image receptor, which lie in another beam path 66, which forms a straight continuation of the common part of the beam paths of the electron beams 12, 30. When the magnetic field 20 is switched off and photo-electrons are generated at the surface of the sample 28 by the UV radiation from the UV source 56, a photo-electron image of the surface of the sample 28 with moderate magnification (e.g. 400×) can be formed on the luminescent screen 64 by means of the projection lens 62 in combination with the cathode lens 26.

The electron lenses 16, 40a, 40b, 62 are electrostatic einzel lenses in the described embodiment. A typical preferred construction is shown in FIGS. 3a and 3b. It includes a cup-shaped metal part 410, whose flat bottom has a central hole 412. In the open end of the cup there is press fitted a stop-like disc 414. In the interior of the cup there is a central electrode 416 formed approximately hollow cylindrical, which has an outer annular bead, retained by six insulating balls 418 of sapphire or the like between bottom and disc 414. The central electrode has an electrical connection 420 which is led out through a hole in the wall of the metal part 410.

Figure 4:
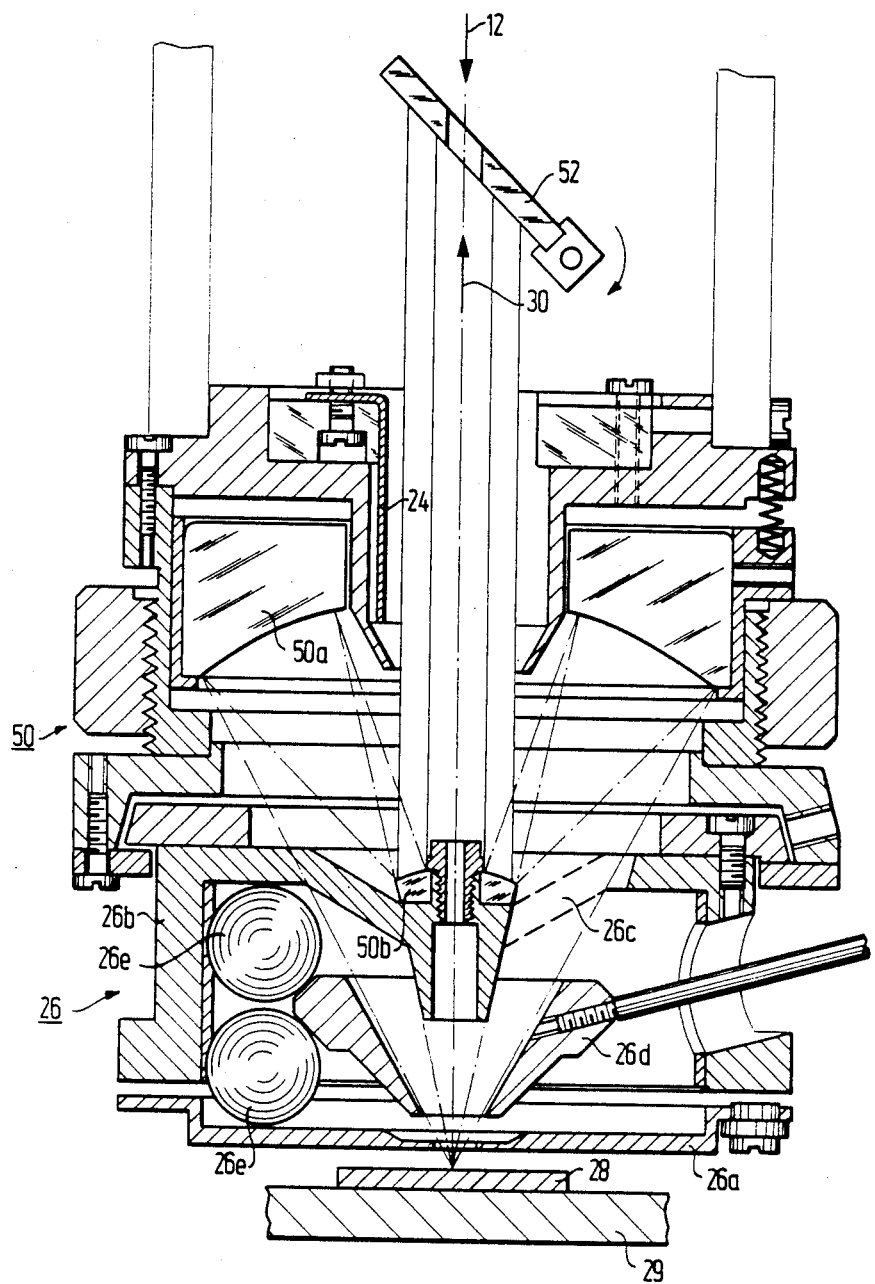
FIG. 4 is an axial section of a part of the electron microscope according to FIG. 1 adjoining the sample to be investigated.

In FIG. 4 a part of the electron microscope is shown in more detail, which includes the mirror 52, the stigmator 24, the Schwarzschild mirror objective 50 and the cathode lens 26. The Schwarzschild objective 50 comprises a spherical concave mirror 50a and a spherical convex mirror 50b. The cathode lens 26 comprises an accelerating electrode 26a, which lies approximately at earth potential and serves to accelerate the electrons from the sample surface lying at approximately −15 kV. The cathode lens 26 further comprises an end electrode 26b at earth potential, which has a cup-shaped outer part and a hollow cylindrical inner part. The outer and inner parts are connected by a conical part, which has apertures 26c for the beam path of the Schwarzschild objective. Between the electrodes 26a and 26b there is retained by two sets each of three sapphire balls 26e a funnel-shaped central electrode 26d lying at approximately −15 kV. Reference is made to the publication of H. Liebl in Optik 80, No. 1 (1988) 4–8 in relation to the cathode lens.

As FIG. 5 shows, the decelerating lens 32 includes two tubular electrodes 32a, 32b, which are held on a rod 32c of insulating material. The lens field exists in the gap 32d between the facing ends of the electrodes 32a, 32b. The electrode 32b is relatively long and comprises a movable holder 34 for a plate with a plurality of slot openings, which can be selectively switched into the secondary beam path 30 and form the contrast stop 34. The accelerating lens 38 shown in FIG. 6 comprises three tubular electrodes 38a, 38b, 38c. The actual accelerating lens is formed by the electric field between the middle electrode 38b and the adjacent ends of the electrodes 38a, 38c. The electrode 38a is relatively long and comprises a holder for the energy stop 48, which can be formed similarly to the contrast stop 34.

The energy resolution of the electrostatic sector field 46 with symmetrical beam path (entrance and exit gap the same distance from the sector field) is given in known manner by $$\Delta U = Us/2r_e,$$

where $U$ is the pass energy, s the width of the entrance and exit gaps (which are formed by the contrast stop 34 or the energy stop 48 as the case may be) and $r_e$ the mean sector field radius.

In the present embodiment the pass energy U=3 keV, the gap widths s=20 μm and the sector field radius $r_e$=36 mm. With these values an energy resolution of ΔU=0.83 eV results.

In order to avoid the image quality suffering from the deflection in the two deflecting fields, the magnetic field 20 and the electrostatic field 46, the known principle of "interlaced beam paths" is employed: the cathode lens 26 images the sample surface in the centre of deflection of the magnetic field 20, the decelerating lens 32 images this first image in the centre of deflection of the deflecting field 46 and the accelerating lens 38 images this second image in the entrance plane of the projection optics 42. In this manner no image errors of the 1st and 2nd order are impressed on the image of the sample surface by the two deflecting fields.

At the same time the focal plane of the cathode lens with the LEED pattern is imaged by the magnetic field 20 and the decelerating lens 32 in the plane of the contrast stop 34 and this for its part in the plane of the energy stop 48, by the electric deflecting field 46.

If the image of the LEED pattern rather then the image of the sample surface is to be made visible on the detector 44, then the accelerating lens 38, which includes the three electrodes 38a, 38b, 38c; FIG. 6, is so adjusted that it images the energy stop 48 rather than the centre of deflection of 46 in the entrance plane of the projection optics 42.

The electron lens 16 can be dispensed with without affecting the energy focusing but the directional focusing of the primary beam should then be effected by other electron optics, e.g. by larger sector angles in the deflecting fields, which then also have lens action.

I claim:

1. Electron microscope comprising:
   a bent primary beam path along which are arranged sequentially an electron beam source, a means for generating a substantially constant magnetic deflecting field and a first electron lens, said electron lens having an object plane, a device for holding the surface of a sample substantially in the object plane of said electron lens; a
   secondary beam path, along which are arranged in sequence a cathode lens, said magnetic deflecting field, means for detecting secondary electrons returned from said surface of a sample, the electron microscope further comprising a means for generating a substantially constant energy-selective electrostatic deflecting field, said means for generating said electrostatic deflecting field arranged in the primary beam path before the magnetic deflecting field and said electrostatic deflecting field so formed that it deflects the primary beam in a direction which is opposite to the direction of deflection of said magnetic deflecting field thereby compensating for the energy dispersion caused by the magnetic deflection field.

2. Electron microscope according to claim 1, wherein the electron lens is a cathode lens.

3. Electron microscope according to claim 1, wherein an electron-optical arrangement for directional focusing is arranged in the primary beam path.

4. Electron microscope according to claim 3, wherein the electron-optical arrangement for directional focusing includes a second electron lens.

5. Electron microscope according to claim 4, wherein the means for generating said energy-selective electrostatic deflecting field is arranged between the second electron lens and said means for generating said magnetic deflecting field wherein the second electron lens images the electron beam source in the entrance side focal plane of the first electron lens.

6. Electron microscope according to claim 4, wherein an aperture stop is arranged in the primary beam path between the electron beam source and the second electron lens.

7. Electron microscope according to claim 1, wherein said means for generating an energy-selective deflecting field is arranged in the secondary beam path between said means for generating a magnetic deflecting field and said means for detecting secondary electrons returned from said surface of sample.

8. Electron microscope according to claim 7, wherein a device decelerating the electrons in the secondary beam path precedes and a device accelerating the electrons in the secondary beam path succeeds said means for generating an energy-selective electrostatic deflecting field in the secondary beam path.

9. Electron microscope according to claim 7, wherein an energy stop is arranged in the secondary beam path after said means for generating an energy-selective electrostatic deflecting field.

10. Electron microscope according to claim 1, wherein the imaging electron-optical device includes a projection objective in the secondary beam path.

11. Electron microscope according to claim 1, comprising a source for a beam of electromagnetic radiation with an energy which enables photoelectrons to be generated at the surface of the sample to be investigated and an optical device for reflecting the beam of radiation into a common part of the primary and secondary beam paths.

12. Electron microscope according to claim 1, wherein an objective system of an optical microscope for optical investigation of the surface of the sample is arranged between said means for generating a magnetic deflecting field and the first electron lens.

13. Electron microscope according to claim 12, wherein the objective system is a Schwarzschild mirror objective.

14. Electron microscope according to claim 12, comprising a mirror, which is arranged in the beam path of the optical microscope between the objective system and an eyepiece and which has an aperture for passage of the electron beam paths.

15. Electron microscope according to claim 14, wherein the mirror is movably mounted for selective removal from the common part of the primary and secondary beam paths.

16. Electron microscope according to claim 1, comprising an imaging beam path, which includes an electron optic and an electron image receiver, such as a luminescent screen for imaging the sample surface with relative small magnification.

* * * * *

UNITED STATES PATENT AND TRADEMARK OFFICE
CERTIFICATE OF CORRECTION

PATENT NO. : 4,978,855

DATED : December 18, 1990

INVENTOR(S) : Liebl et al.

It is certified that error appears in the above-identified patent and that said Letters Patent is hereby corrected as shown below:

Title page, item [75], "Bertold Senetinger" should read --Berthold Senftinger--;

Column 3, line 48, "$(\gamma/\lambda)$" should read --$(\nu/\lambda)$--;

Column 3, line 63, "$\gamma =$" should read --$\nu =$--;

Column 6, line 16, "a" should be deleted.

Column 6, line 17, "a" should appear on the following line before "secondary".

Signed and Sealed this

Eleventh Day of August, 1992

Attest:

DOUGLAS B. COMER

*Attesting Officer*   *Acting Commissioner of Patents and Trademarks*